United States Patent

Singh

[11] Patent Number: 6,091,265
[45] Date of Patent: Jul. 18, 2000

[54] LOW VOLTAGE CMOS INPUT BUFFER WITH UNDERSHOOT/OVERSHOOT PROTECTION

[75] Inventor: Gajendra P. Singh, Sunnyvale, Calif.

[73] Assignee: Sun Microsystems, Inc., San Jose, Calif.

[21] Appl. No.: 09/027,401

[22] Filed: Feb. 20, 1998

[51] Int. Cl.[7] .................. H03K 19/003; H03K 19/094; H03K 3/286
[52] U.S. Cl. .................. 326/83; 326/22; 326/31; 326/121; 327/205
[58] Field of Search .................. 326/80–83, 22–23, 326/68, 31, 112, 119, 121; 327/205, 206

[56] References Cited

U.S. PATENT DOCUMENTS

| | | | |
|---|---|---|---|
| 5,136,186 | 8/1992 | Trinh et al. | 327/142 |
| 5,347,169 | 9/1994 | Preslar et al. | 307/246 |
| 5,349,246 | 9/1994 | McClure | 326/22 |
| 5,371,420 | 12/1994 | Nakao | 326/27 |
| 5,506,539 | 4/1996 | Kelly et al. | 327/379 |
| 5,550,497 | 8/1996 | Carobolante | 327/110 |
| 5,555,149 | 9/1996 | Wert et al. | 361/18 |
| 5,565,795 | 10/1996 | Kawano | 326/81 |
| 5,576,635 | 11/1996 | Partovi et al. | 326/27 |
| 5,646,809 | 7/1997 | Motley et al. | 361/56 |
| 5,717,343 | 2/1998 | Kwong | 326/27 |
| 5,852,540 | 12/1998 | Haider | 326/81 |

OTHER PUBLICATIONS

Connor et al., "Dynamic Dielectric Protection for I/O Curcuits Fabricated in a 2.5V CMOS Technology Interfacing a 3.3V LVTTL Bus," *1997 Symposium on VLSI Circuits Digest of Technical Papers*, pp. 119–120.

*Primary Examiner*—Michael Tokar
*Assistant Examiner*—James A. Cho
*Attorney, Agent, or Firm*—Townsend and Townsend and Crew LLP

[57] ABSTRACT

Method and circuitry for implementing low voltage input buffers using low voltage CMOS transistors are disclosed. Various novel circuit techniques enable the input buffer to safely receive and reliably detect input logic signals in the presence of overshoot or undershoot conditions. In a preferred embodiment, the source terminals of input transistors are biased such that the impact of overshooting or undershooting signals at the input terminal are drastically reduced.

26 Claims, 3 Drawing Sheets

LOW VOLTAGE CMOS INPUT BUFFER WITH UNDERSHOOT/OVERSHOOT PROTECTION

BACKGROUND OF THE INVENTION

The present invention relates in general to integrated circuits, and in particular to a number of circuit techniques that protect transistors in an input buffer circuit from signals experiencing overshoot and undershoot at the input node.

In the field of semiconductor technology, there is continued research and development efforts focused on building next generation devices that are smaller and faster. Reduction in power consumption is another objective of the circuit designers as the demand for battery operated portable electronic devices continues to grow. To reduce power consumption, circuits are being designed with ever decreasing power supply voltages. The current state of the art is pushing the level of the power supply voltages to as low as 1.9 volts for microprocessor circuits and the like. On the other hand, to make integrated circuits faster, field effect transistors are being manufactured with thinner gate oxide layers which limit the voltage swing across the transistor. The maximum tolerable voltage across a transistor in a low voltage circuit that is made up of fast, thin oxide transistors, may in fact be limited to the power supply voltage level. Thus, such a circuit operating with, for example, 1.9 volt supply voltage, must ensure that none of the transistors are subject to voltages greater than 1.9 volts. While protection against voltage stress conditions for transistors that are internal to an integrated circuit may not be an issue, transistors in the input/output (I/O) circuitry may well be exposed to larger than expected external signals.

A typical CMOS input buffer is made up of a CMOS inverter having a p-channel pull-up transistor connected to an n-channel pull-down transistor. The common drain terminal of the two devices drives the internal circuitry while the common gate terminal of the two transistors connects to an external terminal that is typically connected to other circuitry via a transmission line. Mismatches in the impedance of drivers and transmission lines give rise to signal overshoot and undershoot conditions on the transmission lines. Thus, the input transistors may experience voltages greater than that allowed by the process causing reliability problems and damage to input transistor gate oxide.

There is therefore a need for an input buffer circuit that can be implemented with low voltage transistors and that can safely withstand overshoot or undershoot conditions.

SUMMARY OF THE INVENTION

The present invention provides circuit techniques for implementing input buffers with low voltage transistors that are capable of withstanding signal overshoot and undershoot at the external input terminal. The input buffer circuit according to the present invention operates such that no transistor in the input buffer undergoes voltages higher than that allowed by the fabrication process, even though the input signal voltage may experience overvoltage conditions beyond the tolerable voltage levels. This is accomplished without compromising the reliability and speed of the input buffer circuit in detecting the logic levels of the input signal.

Accordingly, in one embodiment, the present invention provides an input buffer circuit including a pull-up transistor having a gate terminal coupled to an input terminal, a first current-carrying terminal coupled to a first node, and a second current-carrying terminal; a pull-down transistor having a gate terminal coupled to the input terminal, a first current-carrying terminal coupled to the first node, and a second current-carrying terminal; and an overshoot bias circuit coupled to the second current-carrying terminal of the pull-down transistor, the overshoot bias circuit being configured to increase a voltage level at the second current-carrying terminal of the pull-down transistor when a high voltage level is applied to the input terminal. The input buffer circuit further includes an undershoot bias circuit coupled to the second current-carrying terminal of the pull-up transistor, the undershoot bias circuit being configured to decrease a voltage level at the second current-carrying terminal of the pull-up transistor when a low voltage level is applied to the input terminal.

A better understanding of the nature and advantage of the input buffer circuit of the present invention may be had with reference to the detailed description and drawings below.

DESCRIPTION OF THE PREFERRED EMBODIMENT

One of the causes of signal overshoot or undershoot is reflection due to improperly terminated transmission lines or mismatches in the impedance of the transmission lines. In case of a CMOS input buffer where gate terminals of MOS devices terminate the transmission line, the termination impedance is almost infinite. This results in a reflected signal that is almost double the magnitude of the incident signal. For low voltage circuits that operate at for example 1.9 volt supply voltages, the reflected signal may be as high as 3.8 volts. Often times, however, the input terminal may have other circuitry such as ESD protection circuitry or output buffer circuitry connecting to it. These circuits usually introduce parasitic electrical components connected to input terminal that effectively limit the overshooting voltage at the input terminal to a lower voltage of for example around 3.1 to 3.3 volts.

The semiconductor process technology may in fact provide for just enough margin to allow the input transistors to safely receive 3 volt signals. However, there may well be applications (e.g., higher speed circuits) where the maximum tolerable voltage for each transistor is essentially limited to the power supply voltage (e.g., 1.9 volts). In these applications, a 3 volt signal at the input terminal subjects the input transistors to voltage stress and oxide damage.

The present invention uses 1.9 volt as an exemplary supply voltage to illustrate the principles of operation of the input buffer circuit of the present invention. It is to be understood that this and other exemplary voltage levels are specified herein for illustrative purposes only and that the solution offered by the present invention may be applied when using other voltage conditions that give rise to similar problems.

Figure 1:
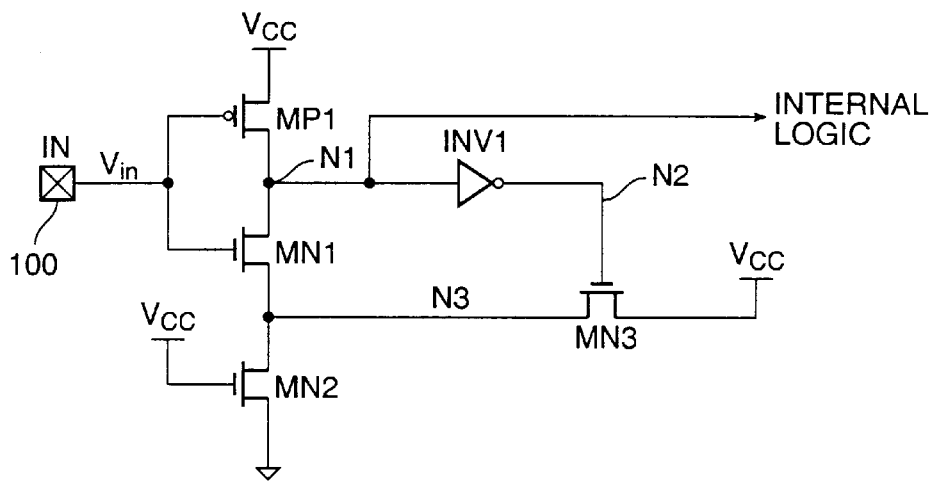
FIG. 1 is a simplified circuit schematic for an exemplary embodiment of the input buffer providing protection against signal overshoot, according to the presentation.

Referring to FIG. 1, there is shown a simplified circuit schematic for an exemplary embodiment protecting the NMOS transistor of the input buffer against overshoot, according to the present invention. An external terminal 100 receives an input signal Vin that normally swings between ground and 1.9 volts. As described above, Vin may in fact overshoot to 3.1 volts. Transistors exposed to this voltage must therefore be able to safely accept a 3.1 volt signal. The input buffer circuit includes an NMOS transistor MN1 that has a gate terminal connected to terminal 100, and a drain terminal connected to node N1. Terminal 100 also connects to a gate terminal of a PMOS transistor MP1 whose drain terminal connects to node N1. To simplify the description of the invention, FIG. 1 only shows the circuitry that protects NMOS transistor MN1 from overshooting Vin signal. Thus, the source terminal of MP1 is shown as being connected to the supply voltage Vcc (1.9 volts), while the source terminal of MN1 connects to node N3. A resistive element in the form of a second NMOS transistor MN2 as shown in this embodiment connects between node N3 and ground. The gate terminal of MN2 is pulled up to Vcc keeping MN2 in an on state. It is to be understood that MN2 is one implementation of the resistive element among several. A third NMOS transistor MN3 connects between node N3 and the power supply Vcc. The output of an inverter INV1 drives the gate terminal of MN3 (node N2) with its input connected to node N1. Node N1 supplies the received signal (inverted) to the internal logic circuitry.

In operation, when Vin is at a logic high level, MP1 turns off and MN1 turns on. Node N1 is thus pulled low by transistors MN1 and MN2. This causes inverter INV1 to drive node N2 to Vcc and to turn on transistor MN3. With both MN2 and MN3 on, a resistive voltage divider is formed between Vcc and ground by the on-channels of these two devices. By appropriately sizing the channels of MN2 and MN3, the desired voltage can be obtained at node N3 when Vin is high. For example, the channel sizes of MN2 and MN3 can be designed to achieve approximately 1.1 volts at node N3 when Vin is about 3 volts. By thus dynamically biasing the source terminal of MN1, the circuit ensures that MN1 does not experience a voltage higher than 1.9 volts across it.

Figure 2:
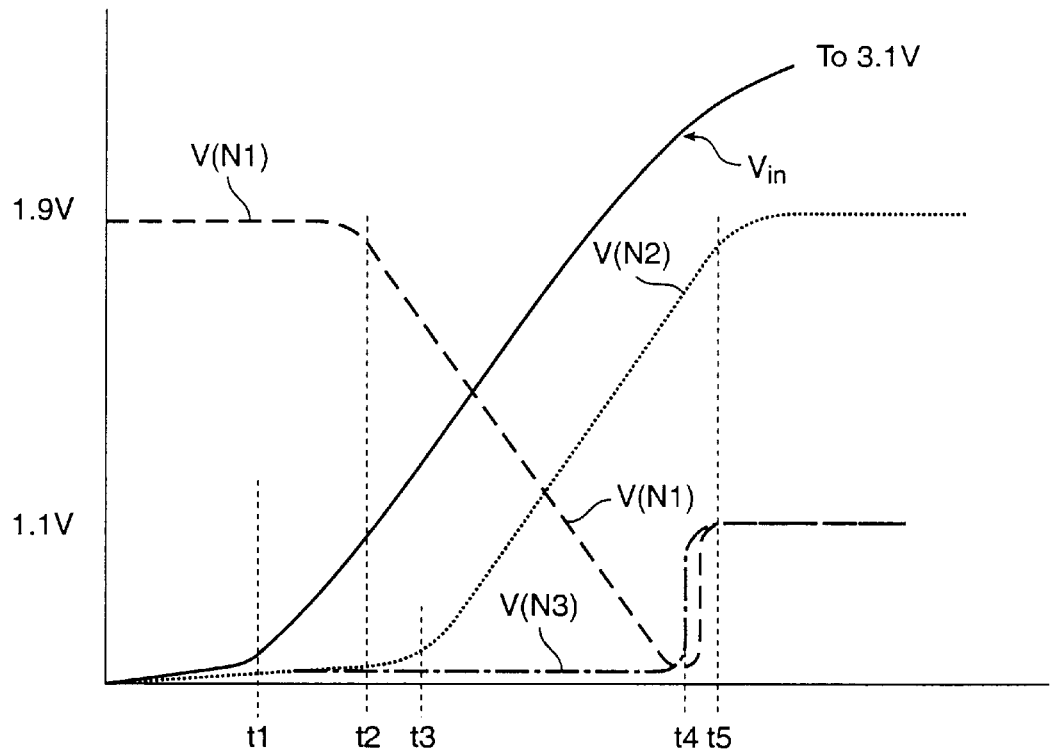
FIG. 2 is a timing diagram showing various waveforms that illustrate the operation of the input buffer of FIG. 1.

While it must protect the input transistors, the primary function of the input buffer is to accurately detect and respond to the logic level of the input signal. As discussed above, the technique of the present invention protects MN1 against an overshooting Vin by raising the voltage level at its source terminal (i.e., at node N3,). The circuit, however, must ensure that this rise in voltage at the source terminal of MN1 does not interfere with accurate detection of the logic level of the input signal. That is, the voltage rise at N3 must not cause the voltage at node N1 to rise above the logic low threshold level. The voltage levels at the various nodes under this condition are illustrated by the waveform diagram of FIG. 2. As shown in FIG. 2, the voltage at node N1, or V(N1), starts to drop down at time t2 (a slight delay after t1) as Vin moves toward Vcc and possibly overshooting up to for example 3 volts. As V(N1) drops, the voltage at node N2, V(N2), starts to move up toward Vcc at time t3. When V(N2) reaches the turn-on voltage of transistor MN3 at time t4, the voltage at node N3, V(N3), starts to rise toward the desired voltage (e.g., 1.1 volts). However, as transistor MN1 turns on with a conducting channel, the rise in V(N3) causes V(N1) to rise, which may erroneously switch the state of INV1.

Figure 3:
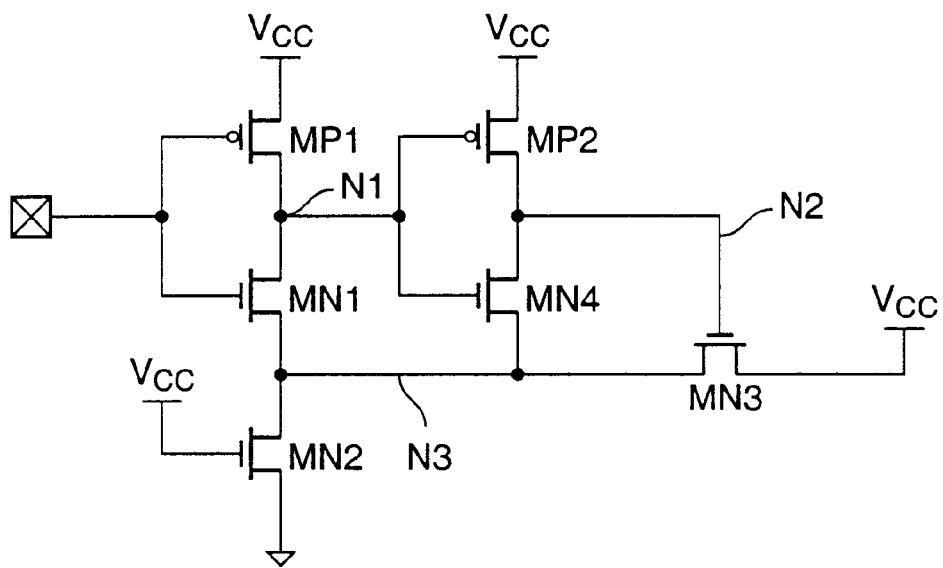
FIG. 3 shows an alternate embodiment of the input buffer circuit of FIG. 1.

To ensure that inverter INV1 does not switch when V(N1) moves up, the present invention connects INV1 between node N3 and Vcc. Referring to FIG. 3, there is shown the improved embodiment, wherein INV1 is implemented by transistors MP2 and MN4 connected together to form an inverter. The same reference numerals are used herein to identify the same element throughout the various figures. Instead of connecting the source terminal of transistor MN4 to ground, however, it is connected to node N3. By thus raising the voltage level at the source terminal of MN4 from ground to V(N3), this inverter would not switch (and node N3 remains high) even if the voltage at node N1 moves up to around 1.1 volts. A higher logic low voltage at node N1 may cause MP2 to be turned on somewhat weaker than it would otherwise. But because V(N1) drops all the way down to ground before it moves back up to 1.1 volts (see FIG. 2), MP2 is turned on strong initially. Thus, a subsequent reduction in the voltage drive for MP2 does not adversely impact the operation of the circuit.

Figure 4:
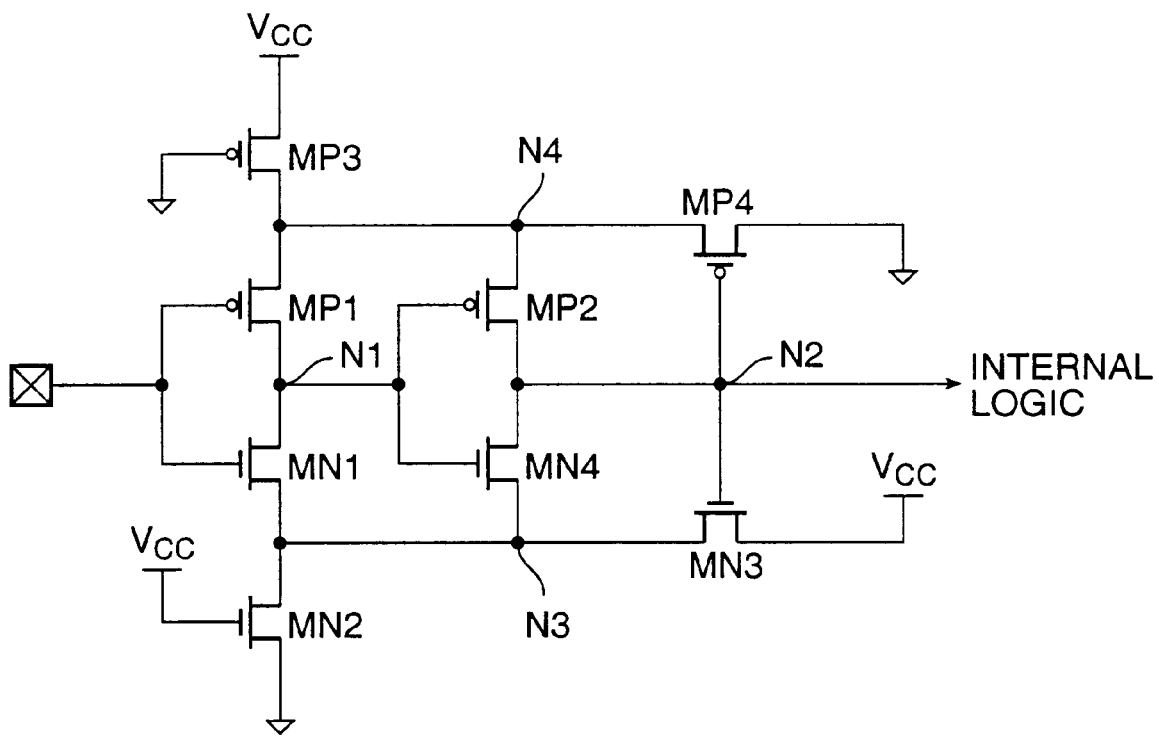
FIG. 4 is a more complete circuit schematic for the input buffer circuit providing protection against both overshoot and undershoot conditions according the present invention.

Thus far the invention has been described in connection with protecting MN1 against an overshooting Vin. Transistor MP1, however, is equally in danger when Vin undershoots. A similar technique whereby the voltage level at the source terminal of MP1 is reduced is adopted to protect MP1 from an undershooting Vin. Referring to FIG. 4, there is shown a complete circuit for the input buffer wherein both MN1 and MP1 are protected against any overshoot or undershoot at Vin. A PMOS transistor MP3 connects between MP1 and Vcc. The gate terminal of MP3 connects to ground to maintain an on state for MP3 causing a voltage drop between Vcc and node N4 when MP1 is on. Another PMOS transistor MP4 connects between node N4 and ground with its gate terminal connected to node N2.

When Vin is at a logic low level (and possibly undershooting), both MP3 and MP4 turn on, providing a resistive voltage divider effect. This half of the circuit operates very similar to the half that protects transistor MN1. The channel sizes of transistors MP3 and MP4 are ratioed such that the voltage at node N4 drops just enough to ensure that when Vin undershoots the voltage applied to MP1 does not exceed 1.9 volts. By connecting the inverter made by MP2 and MN4 between nodes N4 and N3 instead of Vcc and ground, accurate detection of the logic level at Vin is guaranteed. An added advantage of the technique of the present invention is that by thus biasing the source terminals of MN1 and MP1, the trip points of the effective input inverter is essentially skewed such that the circuit responds faster to signal transitions at Vin.

The invention according to the embodiment shown in FIG. 4 operates to move the voltage level at nodes N3 and N4 regardless of whether Vin undershoots/overshoots or not. That is, even when Vin swings between its expected range of ground to 1.9 volts, nodes N3 and N4 are biased as described above. While there is a speed advantage to this biasing of the input devices, it may make the circuit more susceptible to noise. In certain applications, therefore, it may be desirable to reduce this sensitivity to noise. Accordingly, in yet another embodiment, the present invention offers an input buffer circuit that protects the input devices against overshoot and undershoot, while eliminating the increased sensitivity to noise. According to this embodiment, the input buffer turns transistors MN3 and MP4 on only during overshoot and undershoot conditions, respectively. To accomplish this, the input buffer includes overshoot and undershoot detection circuits that detect the condition and then trigger the protection circuitry.

Figure 5:
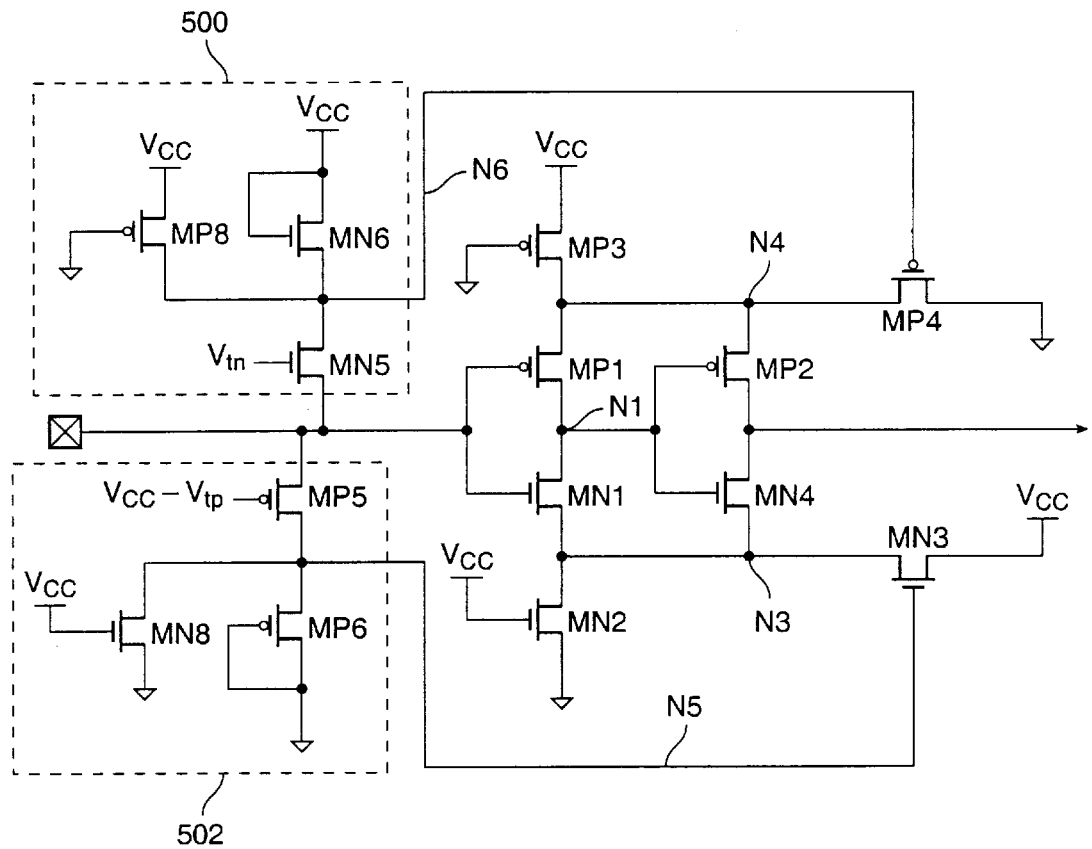
FIG. 5 is yet another embodiment of the input buffer circuit of the present invention with over voltage detectors.

Referring to FIG. 5, there is shown another embodiment of the input buffer according to the present invention. The input buffer is the same as the circuit shown in FIG. 4 except that the gate terminals of transistors MP4 and MN3 are driven by undershoot detector 500 and overshoot detector 502, respectively. In this exemplary simplified embodiment, overshoot detector 502 includes a PMOS transistor MP5 that connects terminal Vin to ground via a diode-connected PMOS transistor MP6 and an NMOS transistor MN8. Transistor MP5 receives a gate bias voltage of (Vcc−Vtp), where Vtp is the threshold voltage for the PMOS transistor. The common node N5 between MP5 and MP6 drives the gate terminal of MN3. Undershoot detector 500 includes two NMOS transistors MN5 and MN6 connected between Vin and Vcc and a PMOS transistor MP8 connected in a similar structure as overshoot detector 502. The gate terminal of transistor MN5 receives a bias voltage equal to Vtn, the threshold voltage for an NMOS transistor.

With (Vcc−Vtp) at its gate terminal, transistor MP5 turns on only when Vin exceeds Vcc, or when Vin overshoots. Thus, as long as Vin remains at or below Vcc, transistors MP6 and MN8 pull node N5 to ground, and transistor MN3 remains off. With transistor MN3 off, node N3 remains at ground by the pull-down action of transistor MN2. As soon as Vin overshoots and rises above 1.9 volts, transistor MP5 turns on pulling node N5 up high, which in turn turns on transistor MN3. In this fashion, the voltage level at node N3 (or the source terminal of MN1) rises only when Vin experiences overshoot condition. Similarly, when Vin undershoots below ground, transistor MN5 turns on pulling node N6 down toward Vin, which in turn turns on transistor MP4. Accordingly, the voltage level at node N4 (or the source terminal of MP1) drops only when Vin experiences undershoot condition.

The overshoot and undershoot detection can be implemented by a variety of different circuitry. The simple over-voltage detection circuits shown in FIG. 5 are exemplary and for illustrative purposes only. A potential problem with simplified detectors shown in FIG. 5 is that because the transistors in detectors 500 and 502 also connect to the external terminal, they themselves must be protected against over-voltage conditions at Vin. For example, if diode-connected PMOS transistor MP6 is too small in size it may well experience voltage stress when Vin overshoots. That is because node N5 may go above Vcc during overshoot. Thus, the size of transistor MP6 is carefully ratioed with that of MN3. Also, transistor MP5 is subject to voltage stress when Vin undershoots. In a further embodiment, the present invention provides detectors that are protected against over-voltage conditions.

Figure 6:
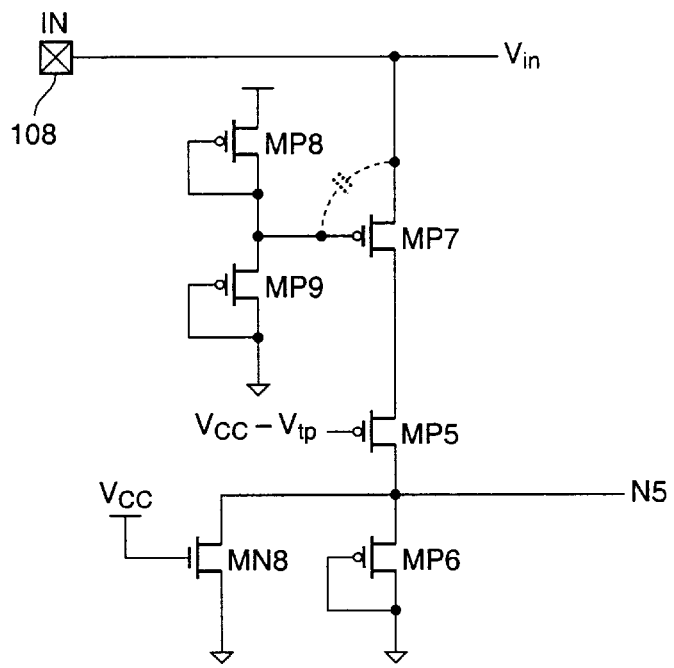
FIG. 6 is a circuit schematic for an alternate embodiment for the over voltage detector used in the input buffer circuit.

Referring to FIG. 6, there is shown circuitry for an improved overshoot detector 600 to be used with the input buffer of the present invention. In this embodiment, a third PMOS transistor MP7 is inserted between MP5 and Vin. The gate terminal of MP7 is biased such that it turns off and disconnects MP5 from Vin when the voltage level at Vin drops below, for example, about Vcc/2 (e.g., 0.9 volts). The bias voltage Vcc/2 volts can be generated by a resistive voltage divider such as a pair of equal sized diode-connected PMOS transistors MP8/MP9 connected between Vcc and ground. By thus biasing the gate terminal of MP7 to Vcc/2, MP7 turns off when Vin drops below Vcc/2. The undershooting Vin signal is thus disconnected from MP5 eliminating the potential of oxide damage. While the insertion of MP7 between Vin and MP5 protects MP5, it may slow the operation of the circuit by adding additional resistance along the detector path. Further, the source-to-gate junction capacitance of MP7 (shown in phantom) may feed Vin to the gate of MP7 pulling the gate up as it overshoots. This further slows down the circuit. The output of the detector (node N5), however, drives the gate terminal of a single transistor (MN3) and therefore does not need to be very strong or fast signal. Yet, there are more robust solutions for the detection circuit examples of which are described in detail in commonly-assigned, patent application Ser. No. 09/015,378, (Atty Docket No. 016747-106/P2966), entitled "Dynamic Biasing for Overshoot and undershoot Protection," by G. P. Singh, which is hereby incorporated by reference in its entirety for all purposes.

In conclusion, the present invention provides method and circuitry for implementing low voltage input buffers using low voltage CMOS transistors are disclosed. Various novel circuit techniques enable the input buffer to safely receive and reliably detect input logic signals in the presence of overshoot or undershoot conditions. In a preferred embodiment, the source terminals of input transistors are biased such that the impact of overshooting or undershooting signals at the input terminal are drastically reduced. While the above describes exemplary embodiments of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. An input buffer circuit comprising:
   a pull-up transistor having a gate terminal coupled to an input terminal, a first current-carrying terminal coupled to a first node, and a second current-carrying terminal;
   a pull-down transistor having a gate terminal coupled to the input terminal, a first current-carrying terminal coupled to the first node, and a second current-carrying terminal; and
   an overshoot bias circuit coupled to the second current-carrying terminal of the pull-down transistor, the overshoot bias circuit being configured to increase a voltage level at the second current-carrying terminal of the pull-down transistor in response to a signal at the input terminal exceeding a first predetermined level defining an overshoot condition.

2. The input buffer circuit of claim 1 further comprising an undershoot bias circuit coupled to the second current-carrying terminal of the pull-up transistor, the undershoot bias circuit being configured to decrease a voltage level at the second current-carrying terminal of the pull-up transistor in response to the signal at the input terminal falling below a second predetermined level defining an undershoot condition.

3. The input buffer circuit of claim 2 wherein the overshoot bias circuit comprises:
   a resistive element coupled between the second current-carrying terminal of the pull-down transistor and a logic low level;
   a switch transistor coupled between a logic high level and the second current-carrying terminal of the pull-down transistor; and
   an inverter having an input terminal coupled to the first node, and an output terminal coupled to a gate terminal of the switch transistor.

4. The input buffer circuit of claim 3 wherein the undershoot bias circuit comprises:
   a resistive element coupled between the second current-carrying terminal of the pull-up transistor and a logic high level;

a switch transistor coupled between a logic low level and the second current-carrying terminal of the pull-up transistor, and having a gate terminal coupled to the output terminal of the inverter.

5. The input buffer circuit of claim 4 wherein the inverter has a logic high power supply terminal coupled to the second current-carrying terminal of the pull-up transistor, and a logic low power supply terminal coupled to the second current-carrying terminal of the pull-down transistor.

6. The input buffer circuit of claim 5 wherein the resistive element in the overshoot bias circuit comprises a transistor having a gate terminal coupled to a logic high level, and wherein, the resistive element in the undershoot bias circuit comprises a transistor having a gate terminal coupled to a logic low level.

7. The input buffer circuit of claim 2 further comprising:

an overshoot detection circuit having a first terminal coupled to the input terminal and a second terminal coupled to the overshoot bias circuit; and an undershoot detection circuit having a first terminal coupled to the input terminal and a second terminal coupled to the undershoot bias circuit.

8. The input buffer circuit of claim 7 wherein the overshoot bias circuit comprises:

a resistive element coupled between the second current-carrying terminal of the pull-down transistor and a logic low level; and a switch transistor coupled between a logic high level and the second current-carrying terminal of the pull-down transistor, and having a gate terminal coupled to the second terminal of the overshoot detection circuit.

9. The input buffer circuit of claim 8 wherein the undershoot bias circuit comprises:

a resistive element coupled between the second current-carrying terminal of the pull-up transistor and a logic high level; and a switch transistor coupled between a logic low level and the second current-carrying terminal of the pull-up transistor, and having a gate terminal coupled to the second terminal of the undershoot detection circuit.

10. The input buffer circuit of claim 9 wherein the overshoot detection circuit comprises:

a first transistor coupled between the input terminal and the second terminal of the overshoot detection circuit, and having a gate terminal coupled to a first predetermined bias voltage; and a second transistor coupled between the second terminal of the overshoot detection circuit and logic low level.

11. The input buffer circuit of claim 10 wherein the first predetermined bias voltage is substantially equal to an overshoot threshold voltage minus a threshold voltage of the first transistor in the overshoot detection circuit.

12. The input circuit of claim 11 wherein the overshoot threshold voltage is substantially equal to a high level as defined by a power supply voltage to the input buffer circuit.

13. The input buffer circuit of claim 10 wherein the undershoot detection circuit comprises:

a first transistor coupled between the input terminal and the second terminal of the undershoot detection circuit, and having a gate terminal coupled to a second predetermined bias voltage; and a second transistor coupled between the second terminal of the undershoot detection circuit and logic high level.

14. The input buffer circuit of claim 13 wherein the second predetermined bias voltage is substantially equal to a logic low level.

15. The input buffer circuit of claim 2 wherein the undershoot bias circuit comprises a current path to a low logic level that is turned on when the signal at the input terminal falls below the second predetermined level.

16. The input buffer of claim 15 wherein the current path comprises:

a resistive element that couples the second current-carrying terminal of the pull-up transistor to a logic high level; and a switch transistor that couples the second current-carrying terminal of the pull-up transistor to the logic high low in response to the signal at the input terminal.

17. The input buffer of claim 16 wherein the bias circuit further comprises an inverting circuit coupled to drive a gate terminal of the switch transistor in response to the signal at the input terminal.

18. The input buffer of claim 16 wherein the bias circuit further comprises an undershoot detection circuit coupled to the input terminal, the undershoot detection circuit being configured to detect the input signal falling below the second predetermined level and to drive the switch transistor accordingly.

19. The input buffer circuit of claim 1 wherein the overshoot bias circuit comprises a current path to a high logic level that is turned on when the signal at the input terminal exceeds the first predetermined level.

20. The input buffer of claim 19 wherein the current path comprises:

a resistive element that couples the second current-carrying terminal of the pull-down transistor to a logic low level; and a switch transistor that couples the second current-carrying terminal of the pull-down transistor to the logic high level in response to the signal at the input terminal.

21. The input buffer of claim 20 wherein the bias circuit further comprises an inverting circuit coupled to drive a gate terminal of the switch transistor in response to the signal at the input terminal.

22. The input buffer of claim 20 wherein the bias circuit further comprises an overshoot detection circuit coupled to the input terminal, the overshoot detection circuit being configured to detect the input signal exceeding the first predetermined level and to drive the switch transistor accordingly.

23. A method for protecting transistors coupled to an external terminal from excessive voltages at the external terminal, comprising:

pulling an internal node to a logic low level in response to a signal at the external terminal using a pull-down transistor;

pulling the internal node to a logic high level in response to the signal at the external terminal using a pull-up transistor; and dynamically biasing the logic low level for the pull-down transistor such that, while the pull-down transistor conducts current, the logic low level for the pull-down transistor varies in response to the signal at the external terminal.

24. The method of claim 23 further comprising dynamically biasing the logic high level for the pull-up transistor such that, while the pull-up transistor conducts current, the logic high level for the pull-up transistor varies in response to the signal at the external terminal.

25. The method of claim 24 wherein the step of dynamically biasing the logic low level comprises:

detecting an overshoot condition at the external terminal; and raising the logic low level for the pull-down transistor in response to the detecting step.

26. The method of claim 24 wherein the step of dynamically biasing the logic high level comprises:

detecting an undershoot condition at the external terminal; and lowering the logic high level for the pull-down transistor in response to the detecting step.

* * * * *